United States Patent [19]

Hatcher

[11] Patent Number: 5,363,112
[45] Date of Patent: Nov. 8, 1994

[54] NOISE SUPPRESSION PROCESSOR FOR A CARRIER TRACKING LOOP

[75] Inventor: George S. Hatcher, Kent, Wash.
[73] Assignee: The Boeing Company, Seattle, Wash.
[21] Appl. No.: 375,484
[22] Filed: Jul. 5, 1989
[51] Int. Cl.⁵ .............................................. H03D 3/18
[52] U.S. Cl. ..................................... 342/389; 331/17
[58] Field of Search ............... 342/103, 389; 331/1 R, 331/17

[56] References Cited

U.S. PATENT DOCUMENTS

| | | |
|---|---|---|
| 2,564,014 | 8/1951 | Lanuza . |
| 2,773,179 | 12/1956 | Makow . |
| 2,828,411 | 3/1958 | Beardwood, III et al. . |
| 3,033,453 | 5/1962 | Lode . |
| 3,193,827 | 7/1965 | Jones et al. . |
| 3,727,220 | 4/1973 | Brennan et al. . |
| 3,995,271 | 11/1976 | Goggins, Jr. . |
| 4,177,430 | 12/1979 | Paul . |
| 4,528,565 | 7/1985 | Hauptmann . |
| 4,532,604 | 7/1985 | Baker . |
| 4,564,815 | 1/1986 | Naito ................................. 331/17 X |
| 4,647,874 | 3/1987 | Rittenbach . |

FOREIGN PATENT DOCUMENTS 634302 11/1978 U.S.S.R. .

*Primary Examiner*—Mark Hellner
*Attorney, Agent, or Firm*—Thomas W. Hennen

[57] ABSTRACT

A noise suppression processor maintains a carrier tracking loop in a receiver in lock in the presence of high noise levels to permit the receiver to measure range changes from a remote transmitter in noisy environments. The noise suppression processor is connected in the carrier tracking loop between the phase detector which produces the loop error signal and the loop filter. The noise suppression processor has a cubic-limiter transfer function to provide nonlinear amplification of the loop error signal while limiting the amplified error signal to predetermined maximum and minimum values.

17 Claims, 12 Drawing Sheets

NOISE SUPPRESSION PROCESSOR FOR A CARRIER TRACKING LOOP

FIELD OF THE INVENTION

This invention relates to a carrier tracking loop in a receiver. More particularly, this invention relates to a noise suppression processor for enhancing the tracking ability of a carrier tracking loop to permit integrated doppler measurements to be made in the presence of high noise levels.

BACKGROUND OF THE INVENTION

Integrated doppler measurement is a ranging technique used extensively in radio-navigation systems such as the global positioning system (GPS) and LORAN-C. The purpose of integrated doppler measurement is to determine line-of-sight range changes between a transmitter and receiver which are moving relative to one another. These range changes can then be used by a navigation computer to precisely determine receiver location and velocity.

Integrated doppler measurement involves the process of measuring at the receiver phase shifts in a signal received from the transmitter and converting the measured phase shifts to a change in transmitter-to-receiver range. The phase shift measurement is typically performed with the aid of a carrier tracking loop which frequency locks a signal generated within the receiver with the received signal. A carrier tracking loop is a closed loop circuit which tracks the phase of a received signal that has either a residual carrier component or a suppressed carrier component. The carrier tracking loop may be a phase-lock loop for residual carrier tracking or a Costas loop or squaring loop for suppressed carrier tracking.

FIG. 1 shows a known receiver 2 which is capable of making integrated doppler measurements. Receiver 2 has an antenna 4 for receiving a signal from a remote transmitter (not shown). The received signal is amplified by low noise amplifier 6 and down-converted by frequency down-converter 8. The output signal, $y_i(t)$, of frequency down-converter 8 is then applied to a first input of phase detector 12 of carrier tracking loop 10. Carrier tracking loop 10 is a conventional analog phase-lock loop consisting of a loop filter 14 connected to phase detector 12 and a voltage controlled oscillator (VCO) 16 connected to loop filter 14 and phase detector 12.

The output signal, $y_o(t)$, of VCO 16, which is an estimate of the received signal as output by the frequency down-converter 8, is applied to a second input of phase detector 12. Phase detector 12 produces a loop error signal, $E_0(t)$, which is related to the phase difference between signals $y_i(t)$ and $y_o(t)$.

In the absence of noise and where the transmitted signal is sinusoidal, signals $y_i(t)$, $y_o(t)$, and $E_0(t)$ typically have the following forms:

$$y_i(t) = B\sin[\theta(t)];$$

$$y_o(t) = C\sin[\hat{\theta}(t)];$$

$$E_0(t) = A\sin[\theta(t) - \hat{\theta}(t)]; \quad \text{(Eq. 1)}$$

where B, C, and A are the maximum noiseless amplitudes of signals $y_i(t)$, $y_o(t)$, and $E_0(t)$, respectively, and $\theta(t)$ and $\hat{\theta}(t)$ are phase processes described by phase offset, frequency, and frequency rate. The value B is maintained substantially constant by an automatic gain control circuit in frequency down-converter 8. The value C is maintained substantially constant by VCO 16. The value A is maintained substantially constant by phase detector 12 when values B and C of signals $y_i(t)$ and $y_o(t)$ are substantially constant.

The error signal $E_0(t)$ is filtered by loop filter 14, which is typically a lead-compensated integrator, to produce a control signal which is applied to the input of VCO 16. The control signal produced by loop filter 14 causes the output signal $y_o(t)$ of VCO 16 to become synchronous with the output signal $y_i(t)$ of frequency down converter 8. When signals $y_i(t)$ and $y_o(t)$ become synchronous, that is, have the same frequency and phase, the carrier tracking loop is locked.

After carrier tracking loop 10 is locked, the value of the control signal produced by loop filter 14 is proportional to $\omega_D$, the Doppler shift in carrier frequency (radians/second) due to the relative velocity between the receiver 2 and the transmitter (not shown). The control signal produced by loop filter 14 is applied to integrator 20 in accumulated delta range (ADR) measurement circuit 18 which performs the integrated doppler measurement.

Integrator 20 produces an output signal having a phase process, that is, phase offset, frequency, and frequency rate, which is equal to the phase process of $y_o(t)$. While carrier tracking loop 10 is locked, the output signal of integrator 20 is indicative of the instantaneous phase, $\phi$, of both the received signal $y_i(t)$ and the estimated signal $y_o(t)$. Sample and hold circuit 22 samples the output of integrator 20 and applies the sampled signal to a first input of sum circuit 24 in response to timing signals from timing controller 30. A second input of sum circuit 24 receives the output signal directly from integrator 20.

Sum circuit 24 determines the change in phase, $\phi(t_i) - \phi(t_{i-1})$, during a time period from time $t_{i-1}$ to $t_i$ and applies a signal indicative of this value to amplifier 26. Amplifier 26 converts this phase change to the line-of-sight range change, $\Delta R$, during the time period from time $t_{i-1}$ to $t_i$, given by:

$$\Delta R = [\lambda/2\pi][\phi(t_i) - \phi(t_{i-1})] = R(t_i) - R(t_{i-1});$$

where:
 $R(t)$ = the line-of-sight range as a function of time; and
 $\lambda$ = known carrier wavelength.

Accumulator 28 sums the measurements of many small range changes, $\Delta R$'s, in response to timing signals from timing controller 30, to determine the accumulated delta range, ADR, given by:

$$ADR = [\lambda/2\pi] \sum_{i=1}^{n} \{\phi(t_i) - \phi(t_{i-1})\}.$$

The ADR value output by accumulator 28 is applied to navigation computer 32 and may be used to calculate the position and velocity of receiver 2.

The ability of receiver 2 to make accurate integrated doppler measurements is dependent on the ability of carrier tracking loop 10 to remain in lock. If carrier tracking loop 10 breaks lock, the output of loop filter 14 will no longer be proportional to the doppler frequency, $\omega_D$. As a result, when carrier tracking loop 10 breaks lock, ADR measurement circuit 18 will be unable to accurately determine line-of-sight range changes between the transmitter and receiver 2.

As is well known, noise which is received by antenna 4 or produced by receiver 2 itself, will be 30 superimposed on the signal received from the transmitter and consequently on error signal $E_0(t)$ produced by phase detector 12. When such noise exceeds a certain level, the carrier tracking loop begins to slip cycles, that is, periodically break lock briefly and then relock. Increasing the noise beyond this level increases the rate at which cycle slipping occurs thus increasing the amount of time that the carrier tracking loop is out of lock until eventually the carrier tracking loop is definitively out of lock and is unable to relock.

Prior attempts to limit the effect of noise on the ability of a carrier tracking loop to remain in lock have been limited to reducing the bandwidth of the loop. Reducing loop bandwidth increases the signal-to-noise ratio (SNR) in the loop since white noise power, $N_o$, and power from "white-like" manmade interference, $N_j$, are functions of bandwidth as given by:

$$N_o = 10\log[kTB];$$

$$N_j = 10\log[JB];$$

where:
k = Boltzman's constant;
T = absolute temperature;
B = bandwidth (Hz); and
J = received jammer power (watts/Hz).

However, the relative movement between the transmitter and receiver affects the limit to which the loop bandwidth can be narrowed and still maintain carrier tracking. For a second order carrier tracking loop with an active integrator loop filter, the steady state phase error, $\phi_{ss}$, is given by:

$$\phi_{ss} = \sin^{-1}[\omega_D/\omega_n^2]; \quad \text{(Eq. 2)}$$

where:
$\omega_n$ = loop bandwidth;
$\omega_D = a\omega_c/c$;
a = line-of-sight acceleration between the transmitter and receiver;
c = speed of light; and
$\omega_c$ = carrier frequency. For $|\phi_{ss}| \leq \pi/10$, $\omega_{n=\omega D}/|\phi_{ss}|$ and the carrier tracking loop will remain locked onto the carrier signal. If $\phi_{ss}$ exceeds the breaklock limit of about $\pi/10$ radians or 18 degrees, the loop error signal becomes nonlinear and the loop will break lock. Hence, the minimum loop bandwidth, $\omega_{nmin}$, is given by:

$$\omega_{nmin} = \sqrt{10\omega_D/\pi} \text{ radians/second.} \quad \text{(Eq. 3)}$$

Experimental studies have shown that the minimum signal-to-noise ratio, $SNR_{min}$, with which a carrier tracking loop of bandwidth $\omega_{nmin}$ can remain locked onto a signal having a doppler rate $\omega_D$ and white noise interference is given by:

$$SNR_{min} = 10\log[\omega_{nmin}/^{20\pi}]dB. \quad \text{(Eq. 4)}$$

For signal-to-noise ratios less than $SNR_{min}$, a carrier tracking loop with a bandwidth of $\omega_{nmin}$ will break lock and accurate integrated doppler measurements will not be able to be performed.

Accordingly, in order to be able to perform accurate integrated doppler measurements in the presence of noise levels which result in a signal-to-noise ratio less than $SNR_{min}$, a need exists for a carrier tracking loop which will maintain lock in the presence of such noise levels.

SUMMARY OF THE INVENTION

It is an object of the present invention to enable a carrier tracking loop to remain in lock in the presence of high noise levels.

It is also an object of the present invention to permit integrated doppler measurements to be made in the presence of high noise levels.

These and other objects of the present invention are achieved by a noise suppression processor which processes the carrier tracking loop error signal by nonlinearly amplifying the loop error signal while limiting the amplified loop error signal to predetermined maximum and minimum values.

BRIEF DESCRIPTION OF THE DRAWINGS

FIG. 7a shows a second embodiment of a noise suppression processor according to the present invention.

FIG. 7b is a flow chart showing the steps performed by a program stored in the noise suppression processor of FIG. 7a.

DETAILED DESCRIPTION OF THE DRAWINGS

Figure 1:
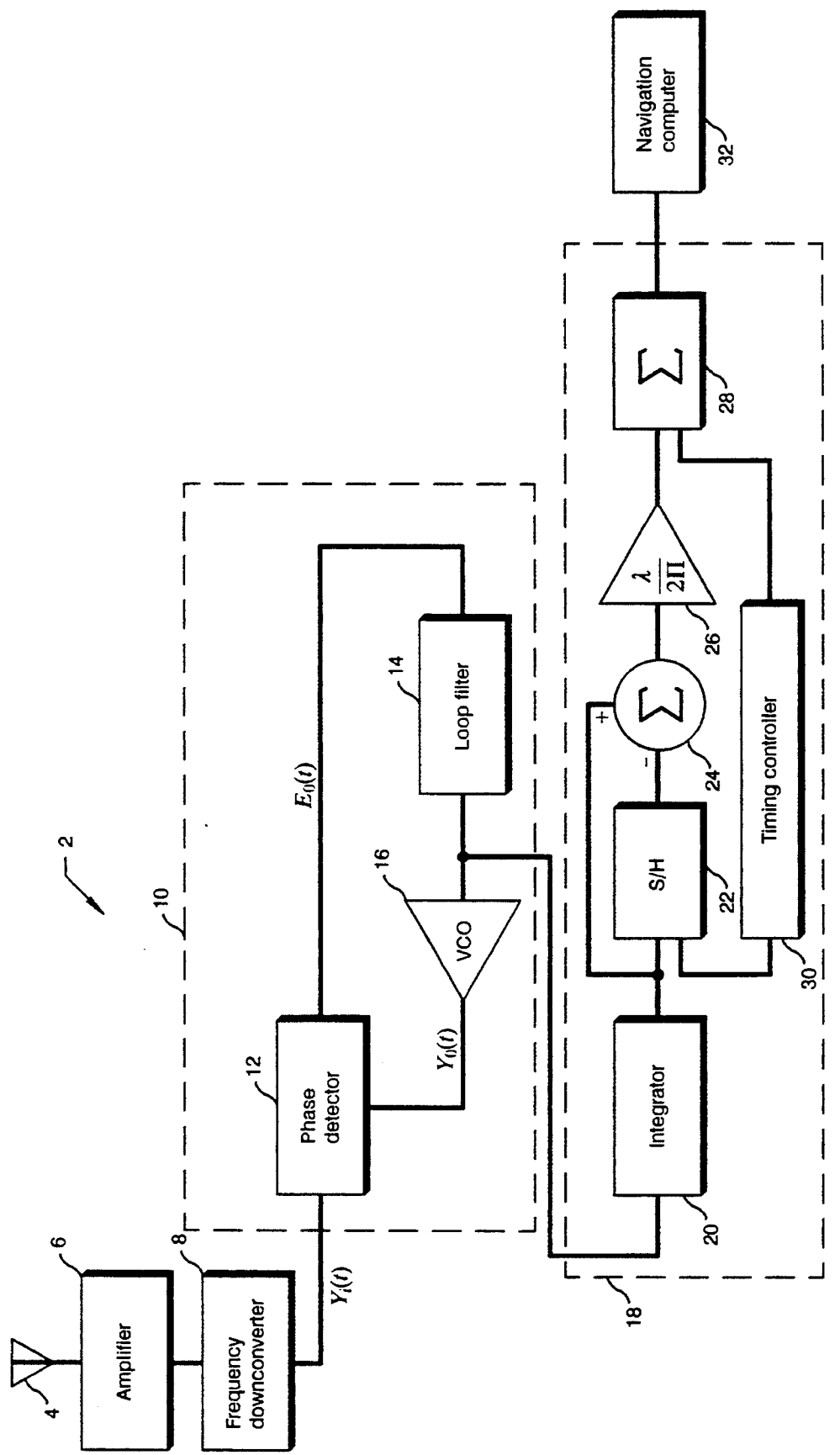
FIG. 1 shows a receiver for making integrated doppler measurements with a carrier tracking loop according to the prior art.
Figure 2:
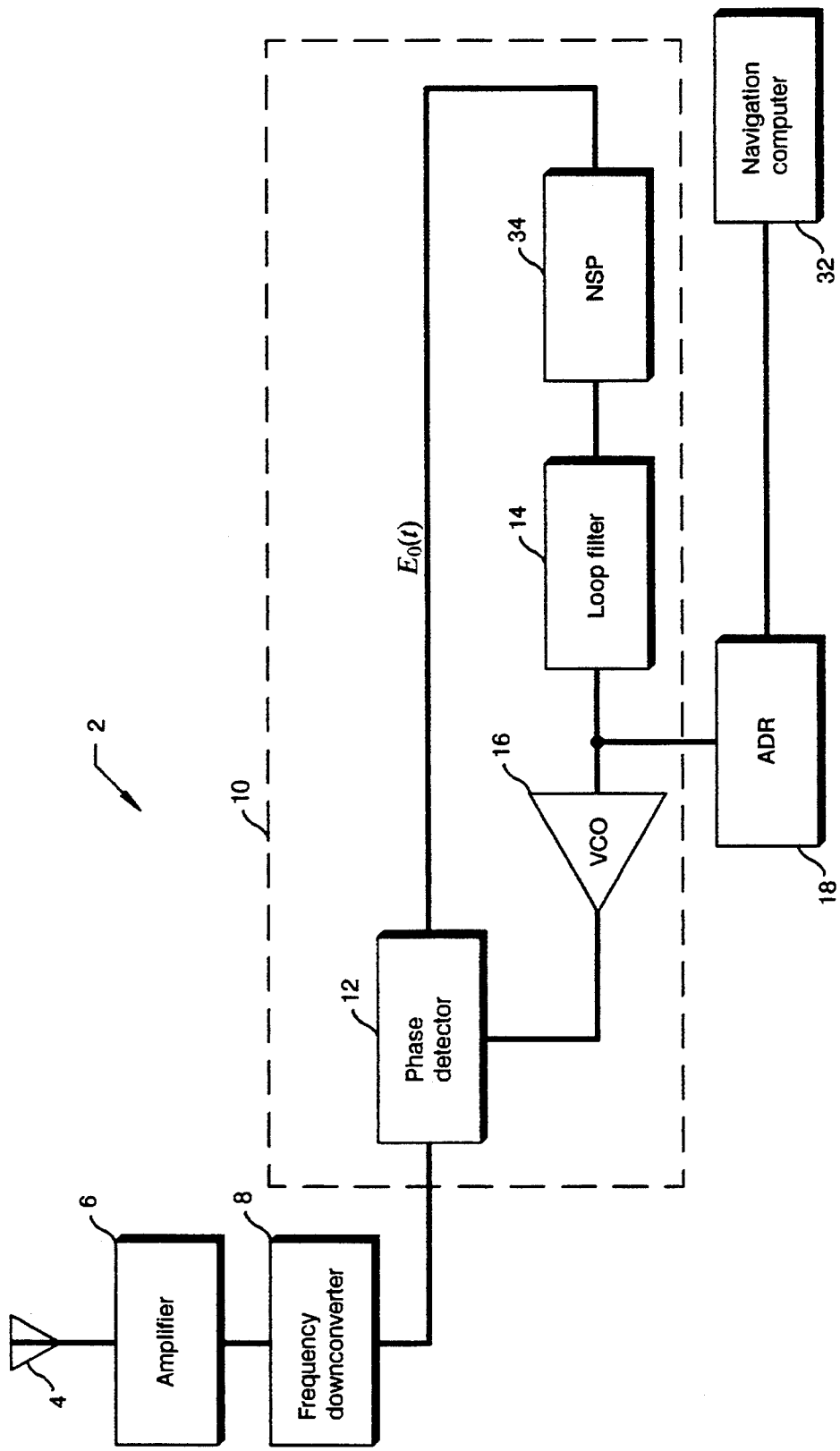
FIG. 2 shows the receiver of FIG. 1 with the noise suppression processor of the present invention added to the carrier tracking loop.

FIG. 2 shows receiver 2 of FIG. 1 with the noise suppression processor 34 of the present invention inserted in carrier tracking loop 10. Noise suppression processor 34 permits carrier tracking loop 10 to remain in lock in the presence of high levels of interfering noise. As a result, accurate integrated doppler measurements can continue to be made in the presence of high levels of interfering noise by accumulated delta range measurement circuit 18.

Noise suppression processor 34 is connected between phase detector 12 and loop filter 14. The loop error signal $E_0(t)$ produced by phase detector 12 is applied to the input of noise suppression processor 34. In the presence of noise, the error signal $E_0(t)$ is given by:

$$E_0(t) = A\sin[\theta_{68}(t)] + n(t);\ \text{where:}$$

$$\theta_{68}(t) = \theta(t) - \hat{\theta}(t)\ \text{from equation 1;}$$

A = maximum noiseless error signal amplitude as in equation 1; and n(t) is white gaussian noise (WGN).

Noise suppression processor 34 has a cubic-limiter nonlinear transfer function, $N[E_0(t)]$, which is discontinuous and is given by:

$$N[E_0(t)] = 1.2A\ \text{for}\ E_0(t) + E_0^3(t)/\eta \geq 1.2A; \quad \text{(Eq. 5)}$$

$$N[E_0(t)] = E_0(t) + E_0^3(t)/\eta\ \text{for} \quad \text{(Eq. 6)}$$

$$-1.2A < E_0(t) + E_0^3(t)/\eta < 1.2A;$$

and $$N[E_0(t)] = -1.2A\ \text{for}\ E_0(t) + E_0^3(t)/\eta \leq -1.2A. \quad \text{(Eq. 7)}$$

where:

$\eta = A^2/\pi$.

Noise suppression processor 34 thus provides nonlinear amplification of the error signal $E_0(t)$ by the quantity $1 + E_0^2(t)/\eta$ while limiting the amplified error signal to a maximum value of 1.2A and a minimum value of $-1.2A$.

Figure 3:
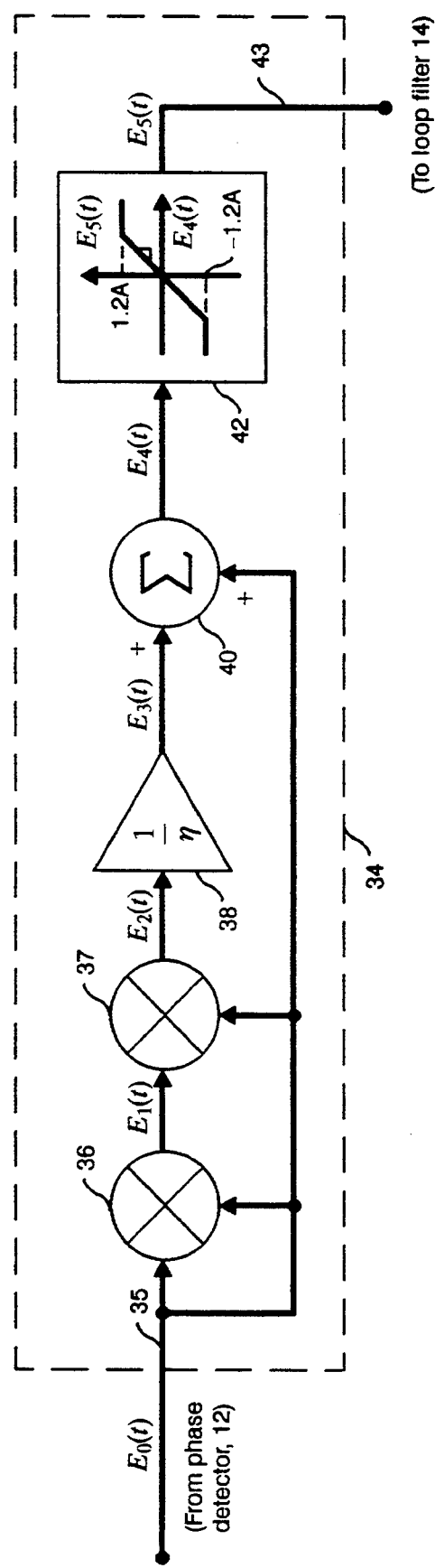
FIG. 3 is a schematic diagram of a first embodiment of the noise suppression processor of the present invention.

FIG. 3 shows an electrical schematic diagram of a first embodiment of noise suppression processor 34 having the transfer function $N[E_0(t)]$ given in equations 5–7 above. In this embodiment, noise suppression processor 34 has an input line 35 which receives error signal $E_0(t)$ from phase detector 12. The error signal $E_0(t)$ is then applied to first and second inputs of multiplier 36 which produces an output signal $E_1(t)$ equal to $E_0^2(t)$. Multiplier 37 has a first input which receives the output signal $E_1(t)$ from multiplier 36 and a second input which receives error signal $E_0(t)$. Multiplier 37 produces an output signal $E_2(t)$ equal to $E_0^3(t)$. Amplifier 38 receives output signal $E_2(t)$ from multiplier 37 and produces an output signal $E_3(t)$ equal to $E_0^3(t)/\eta$, where $\eta$ equals $A^2/\pi$. A is the maximum noiseless amplitude of error signal $E_0(t)$ and is maintained substantially constant by phase detector 12. The value of A, which must be known to construct amplifier 38 and limiter 42 discussed below, can be determined by measuring the output of phase detector 12 when signals $y_i(t)$ and $y_o(t)$ are applied to the inputs of phase detector 12 in a noise free environment.

Summer 40 has a first input which receives output signal $E_3(t)$ from amplifier 38 and a second input which receives error signal $E_0(t)$. Summer 40 produces an output signal $E_4(t)$ equal to $E_0(t) + E_0^3(t)/\eta$ which is applied to the input of limiter 42. Limiter 42 produces an output signal $E_5(t)$ given by:

$$E_5(t) = 1.2A\ \text{for}\ E_4(t) \geq 1.2A;$$

$$E_5(t) = E_4(t) = E_0(t) + E_0^3(t)/\eta\ \text{for}\ -1.2A < E_4 < 1.2A;$$

and $$E_5(t) = -1.2A\ \text{for}\ E_4(t) \leq -1.2A.$$

Signal $E_5(t)$ is supplied to loop filter 14 via output line 43 of noise suppression processor 34.

Figure 4C:
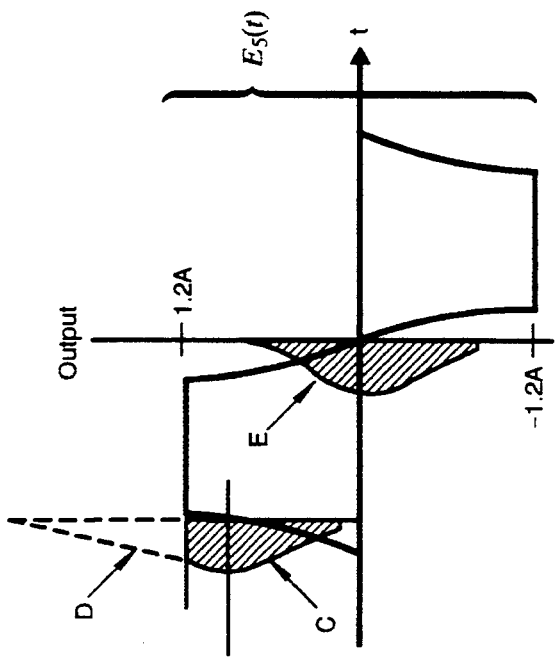
FIGS. 4a–4c are graphs illustrating the effect of the noise suppression processor of the present invention on a carrier tracking loop error signal containing noise.
Figure 4B:
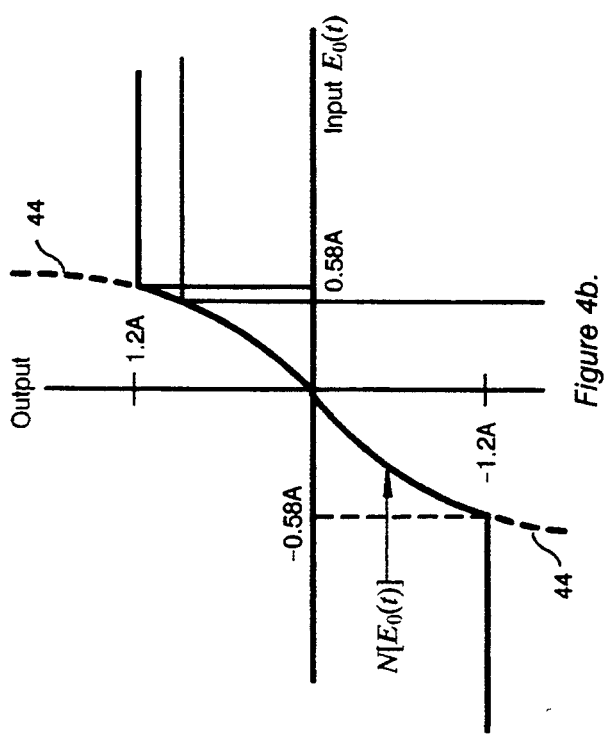
Figure 4A:
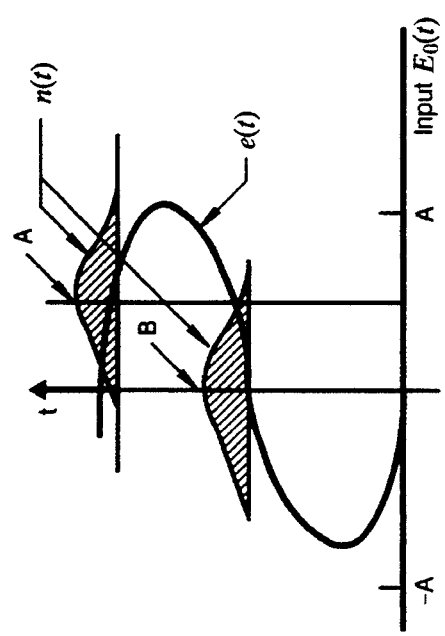

FIGS. 4a–4c graphically illustrate the effect of the noise suppression processor of the present invention on a carrier tracking loop error signal containing white, gaussian noise. The error signal is given by:

$$E_0(t) = e(t) + n(t);$$

$e(t) = A\sin[\theta_\epsilon(t)]$, the noiseless error signal; and n(t) is white, gaussian noise.

In FIG. 4a, error signal $E_0(t)$ which is applied to the input of the noise suppression processor is shown as a function of time with the horizontal axis representing the magnitude of the error signal and the vertical axis representing time. Error signal $E_0(t)$ is depicted as the noiseless error signal e(t) with the white, gaussian noise amplitude distribution superimposed at two e(t) values. While the noise amplitude distribution is actually superimposed on all points of e(t), it is only shown added to two points of e(t) for ease of understanding. Region A shows the noise amplitude distribution added to e(t-)=A/2, or where $\theta_{68}(t) = \pi/10$ or 18 degrees which is the breaklock limit. Region B shows the noise amplitude distribution added to e(t)=0, or where $\theta_{68}(t) = 0$.

FIG. 4b shows the cubic-limiter nonlinear transfer function with the horizontal axis representing the noise suppression processor input signal, $E_0(t)$, and the vertical axis representing the output signal of the noise suppression processor. As shown in FIG. 4b, the transfer function of the noise suppression processor limits the output signal to a maximum value of $+1.2A$ when the value of the input signal is greater than or equal to $+0.58A$. The transfer function of the noise suppression processor also limits the output signal to a minimum value of $-1.2A$ when the value of the input signal is less than or equal to $-0.58A$. For input signal values between $-0.58A$ and $+0.58A$, the transfer function of the noise suppression processor produces an output signal to equal $E_0(t)\{1 + E^2(t)/\eta\}$. The dashed portions 44 show what the transfer function would be if unlimited. The transfer function of FIG. 4b is analogous to a mirror which reflects the input signal of FIG. 4a to give the output signal of FIG. 4c.

In FIG. 4c, the output signal of the noise suppression processor is shown with the horizontal axis representing time and the vertical axis representing the magnitude of the output signal. Regions C and E show the noise distribution at the output of the noise suppression processor due to the input noise distribution at regions A and B, respectively, of FIG. 4a. The dashed portion at region D shows the resultant noise distribution if unlimited. The effect of the limiting process is to keep the mean noise value at the output of the noise suppression processor equal to the noiseless error signal amplitude at the output of the noise suppression processor. The equating of the noise mean value and noiseless error signal amplitude holds when the error signal is in the linear region, that is, where $|\theta_{68}(t)| \leq \pi/10$ or 18 degrees, and the signal-to-noise ratio is no more than 4 dB lower than the value $SNR_{min}$ given in equation 4.

The impact on the error signal $E_0(t)$ by the cubic-limited transfer function can be understood by considering the operation of the tracking loop in the absence of noise, that is, when n(t)=0 and $E_0(t) = e(t)$. It is well known that the bandwidth of a carrier tracking loop is proportional to the signal amplification on the feedback path. In the absence of noise, the noise suppression processor provides amplification of the error signal e(t) by the amount $1+e^2(t)/\eta$. When e(t) is very small the gain of the noise suppression processor is approximately 1. As the magnitude of e(t) grows, however, the gain increases and, correspondingly, so does the loop bandwidth.

The noise suppression processor thus allows a continuous adaptive carrier loop bandwidth which increases as the error signal grows, thus reducing the loop steady state phase error as given in Equation 2 while simultaneously maintaining the loop mean noise to a value approximately equal to the noiseless error signal amplitude. As a result, the noise suppression processor gives the carrier tracking loop the ability to maintain lock on an incoming signal with sufficient accuracy to allow accurate ADR measurements when the carrier tracking loop SNR drops up to 4 dB lower than the minimum value, $SNR_{min}$ (see Equation 3), possible with the bandwidth reduction technique of the prior art.

In addition to enhancing the carrier tracking ability of receivers, such as receiver 2 of FIG. 2 which use residual carrier tracking, noise suppression processor 34 may also be used to enhance the carrier tracking ability of receivers which use suppressed carrier tracking. The carrier tracking loop in receivers which use suppressed carrier tracking is typically a squaring loop or a Costas loop. As in the phase-lock carrier tracking loop 10 of FIG. 2, when used in a suppressed carrier tracking loop, noise suppression processor 34 is connected between the loop filter and the phase detector immediately preceeding the loop filter.

Figure 5:
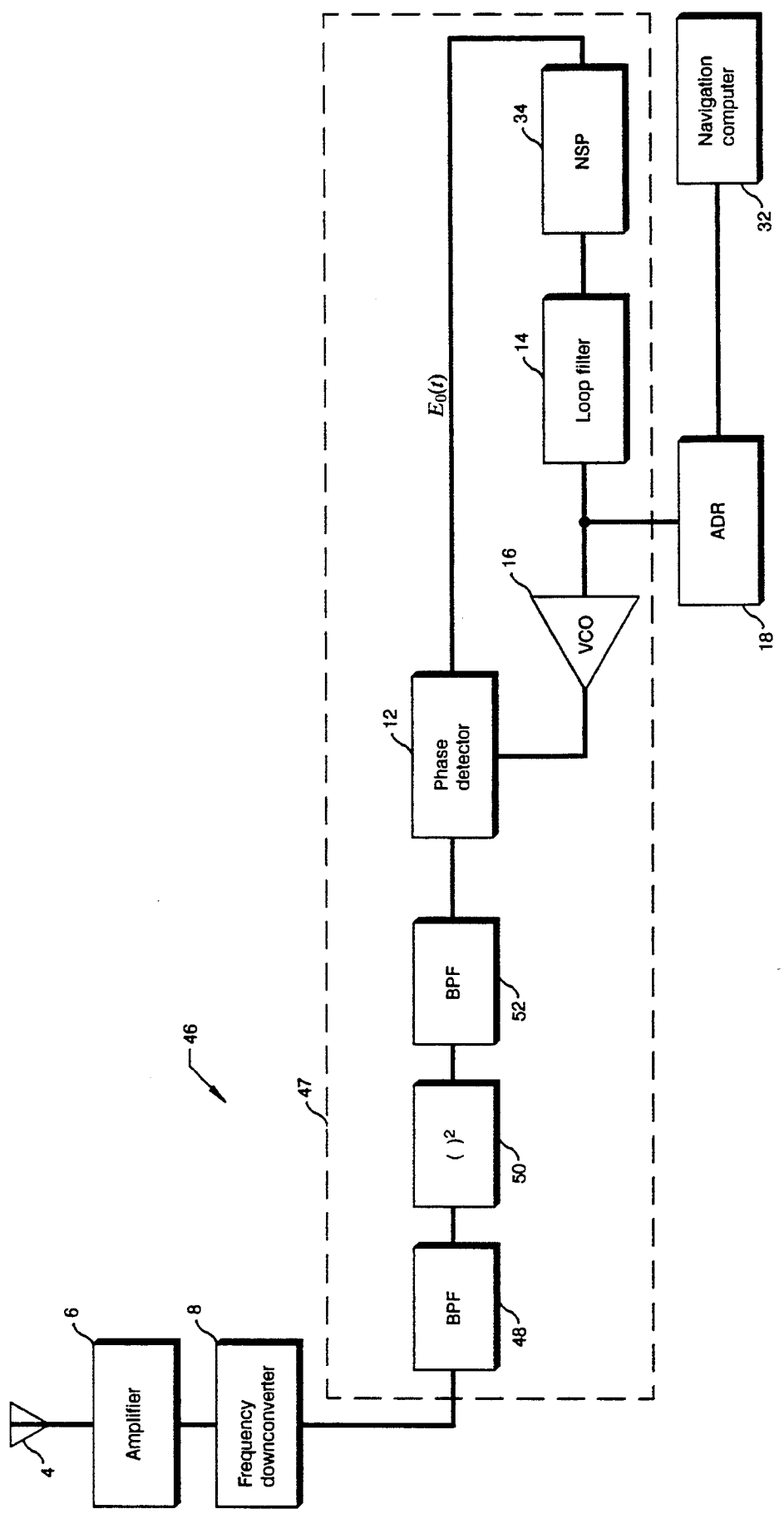
FIG. 5 shows the noise suppression processor of FIG. 3 in a receiver having a squaring loop.

FIG. 5 shows a receiver 46 which is identical to receiver 2 of FIG. 2 with the exception that a squaring loop 47 is used as the carrier tracking loop in place of phase-lock loop 10. Squaring loop 47 is a conventional squaring loop to which noise suppression processor 34 has been added between phase detector 54 and loop filter 56. Squaring loop 47 includes a band pass filter 48 which receives the down-converted signal produced by frequency down-converter 8. The filtered down-converted signal produced by band pass filter 48 is squared by squaring circuit 50 and filtered again by band pass filter 52. Phase detector 12 receives signals from band pass filter 52 and VCO 16 at first and second inputs, respectively, and produces the loop error signal $E_0(t)$ which is processed by noise suppression processor 34 as discussed above with respect to FIGS. 3–4c. Loop filter 14 produces a control signal which causes the output signal of VCO 16 to become synchronous with the output signal of frequency down-converter 8. The control signal produced by loop filter 14 is also applied to ADR measurement circuit 18 which determines line-of-sight range changes as discussed above with respect to FIG. 1.

Figure 6:
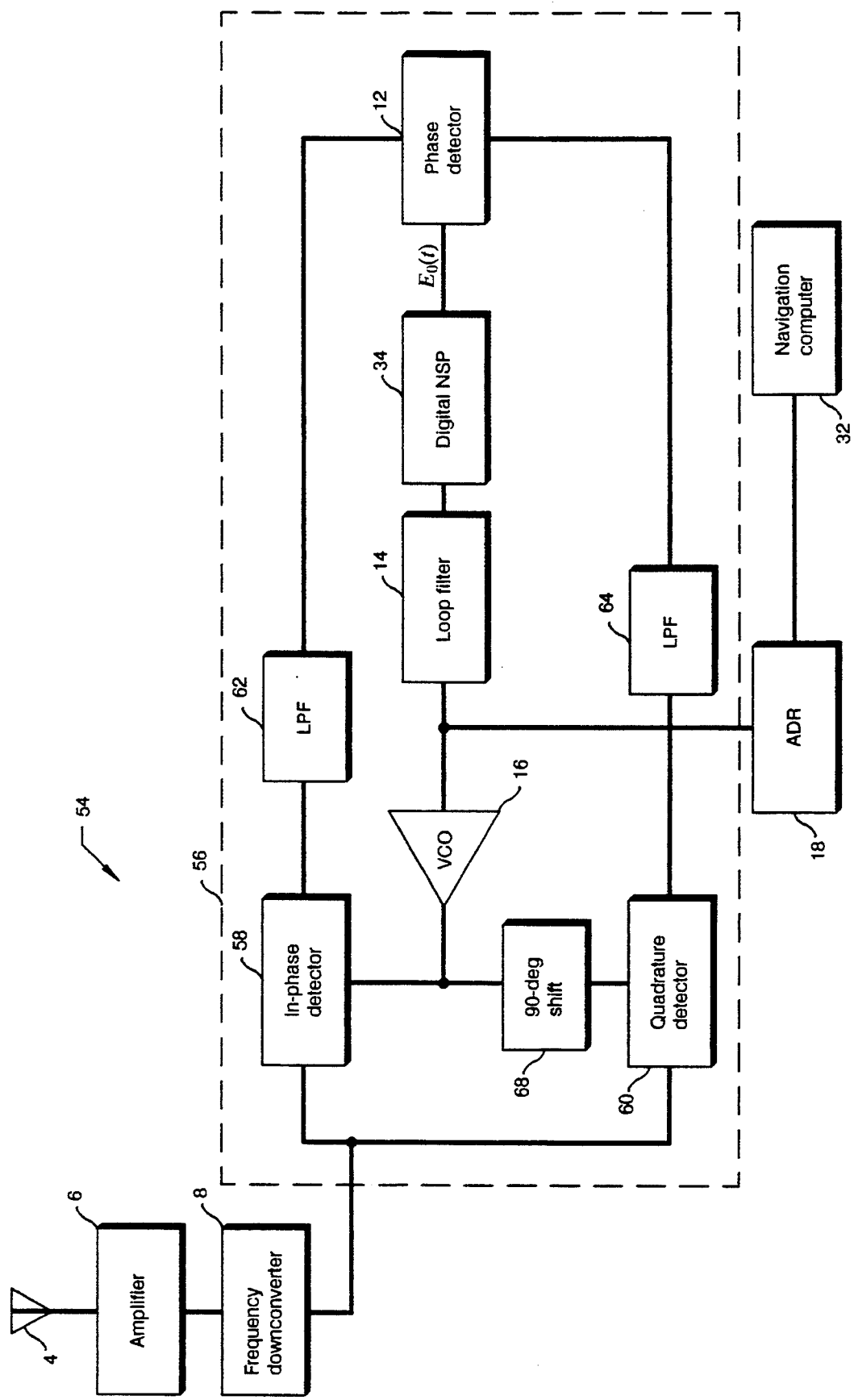
FIG. 6 shows the noise suppression processor of FIG. 3 in a receiver having a Costas loop.

FIG. 6 shows a receiver 54 which is identical to receiver 2 of FIG. 2 with the exception that a Costas loop 56 is used as the carrier tracking loop in place of phase-lock loop 10. Costas loop 56 is a conventional Costas loop with the exception of noise suppression processor 34 which has been added between phase detector 12 and loop filter 14. Costas loop 56 includes in-phase detector 58 and quadrature phase detector 60, each of which receives the down-converted signal from frequency down-converter 8 at a first input. In-phase detector 58 also receives a signal from VCO 16 at a second input and produces an output signal which is filtered by low pass filter 62 and then applied to a first input of phase detector 12. Quadrature phase detector 60 receives at a second input a signal from VCO 16 which has been shifted 90 degrees by phase shifter 68. Quadrature phase detector 66 produces an output signal which is filtered by low pass filter 64 and applied to a second input of phase detector 12. Phase detector 12 produces the loop error signal $E_0(t)$ which is processed by noise suppression processor 34 as discussed above with respect to FIGS. 3–4c and applied to loop filter 14. Loop filter 14 produces a control signal which causes the output of VCO 16 to become synchronous with the output signal of frequency down-converter 8. The control signal produced by loop filter 14 is also applied to ADR measurement circuit 18 which determines line-of-sight range changes as discussed above with respect to FIG. 1.

Figure 7:
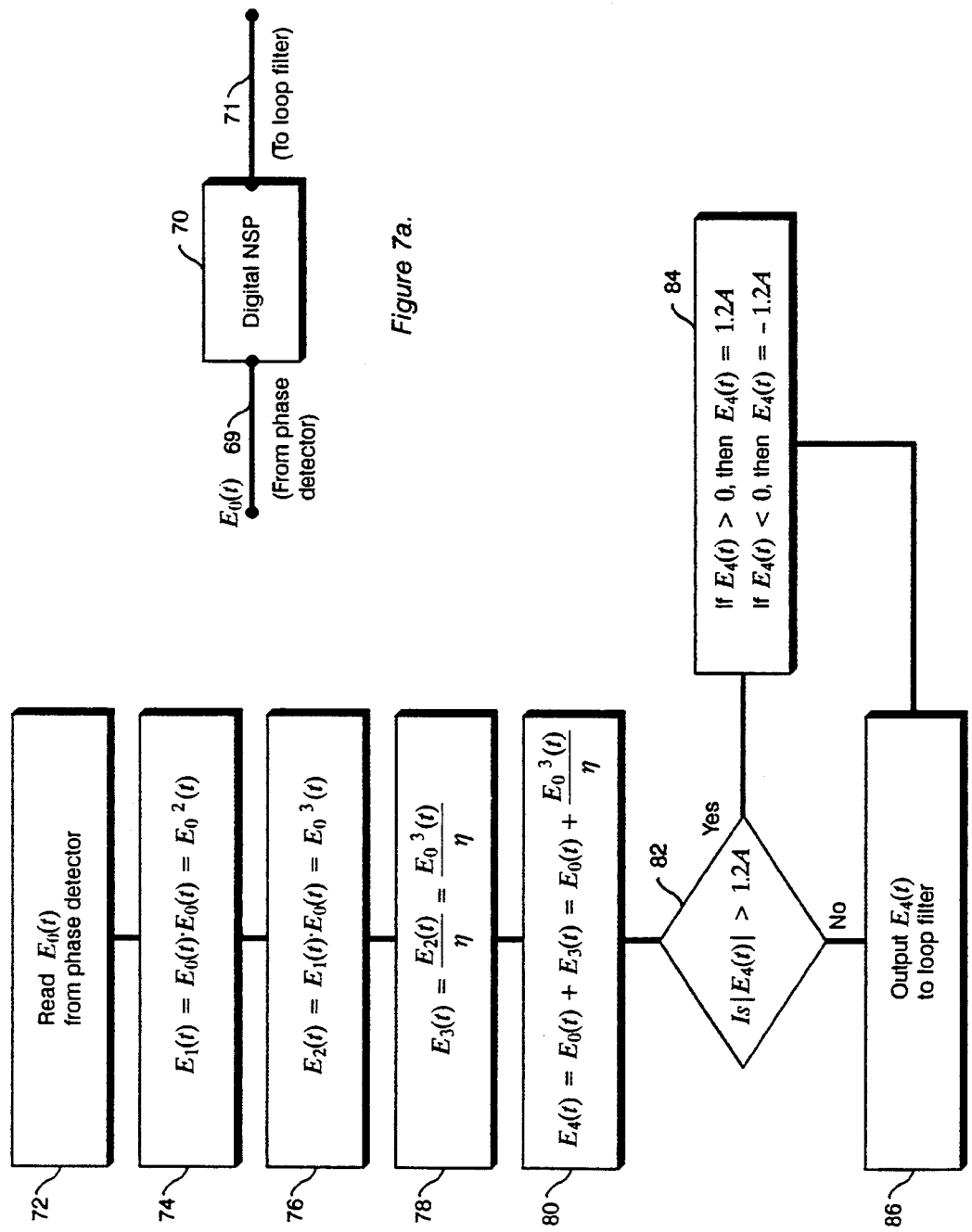

FIG. 7a shows a second embodiment of a noise suppression processor according to the present invention. The noise suppression processor of this embodiment is a digital implementation of noise suppression processor 34 of FIG. 3 and may be used in digital carrier tracking loops. Digital noise suppression processor 70 comprises a computer having an input line 69 for receiving the loop error signal $E_0(t)$ from a digital phase detector in a carrier tracking loop. The error signal $E_0(t)$ is processed in accordance with a program stored in the computer to produce a digital control signal which is applied to a digital loop filter in the carrier tracking loop via output line 71. The stored program digitally implements the transfer function of noise suppression processor 34 of FIG. 3 given above in equations 5–7.

FIG. 7b is a flow chart showing the steps performed by the program stored in digital noise suppression processor 70. The error signal $E_0(t)$ is read from the digital phase detector at step 72 and squared at step 74 to produce $E_1(t)$. At step 76, $E_2(t)$ is produced which is equal to the product of $E_1(t)$ and $E_0(t)$. At step 78, $E_3(t)$ is formed by multiplying $E_2(t)$ by $1/\eta$, where $\eta = A^2/\pi$ and A = the maximum noiseless error signal amplitude as in equation 1. At step 80, $E_4(t)$ is produced by adding $E_0(t)$ and $E_3(t)$. At step 82, it is determined if the absolute value of $E_4(t)$ is greater than 1.2A. If the absolute value of $E_4(t)$ is not greater than 1.2A, $E_4(t)$ is output to the digital loop filter at step 86. If the absolute value of $E_4(t)$ is greater than 1.2A, a determination is made in step 84 as to whether $E_4(t)$ is greater than 0 or less than 0. If $E_4(t)$ is greater than 0, then $E_4(t)$ is set equal to 1.2A and output to the digital loop filter at step 86. If $E_4(t)$ is less than 0, then $E_4(t)$ is set equal to $-1.2A$ and output to the digital loop filter at step 86.

Figure 8:
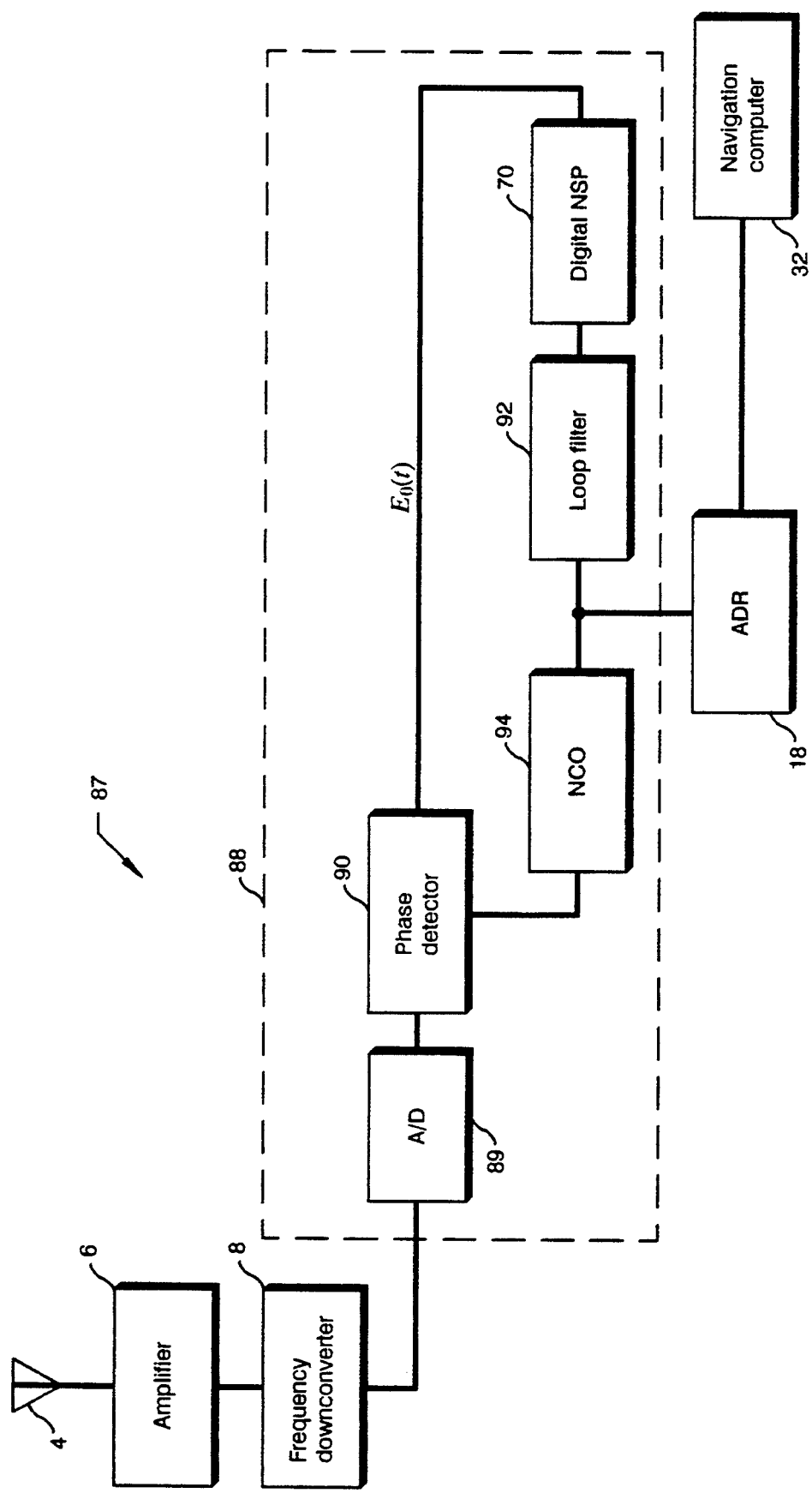
FIG. 8 shows the noise suppression processor of FIG. 7a in a receiver having a digital phase-lock loop.

FIG. 8 shows a receiver 87 which is identical to receiver 2 of FIG. 2 with the exception that a digital phase-lock loop 88 is used as the carrier tracking loop in place of analog phase-lock loop 10. Digital phase-lock loop 88 is a conventional digital phase-lock loop to which digital noise suppression processor 70 has been added between digital phase detector 90 and digital loop filter 92. Digital phase-lock loop 88 includes an analog-to-digital converter 89 which converts the down-converted signal produced by frequency down-converter 8 to a digital value. The digital value produced by analog-to-digital converter 89 is applied to a first input of digital phase detector 90. Digital phase detector 90 also receives a signal from numerically controlled oscillator (NCO) 94 at a second input and produces the loop error signal $E_0(t)$ which is processed by digital noise suppression processor 70 as discussed above with respect to FIG. 7b. Digital loop filter 92 produces a control signal which causes the output signal of NCO 94 to become synchronous with the output signal of analog-to-digital converter 89. The control signal produced by digital loop filter 92 is also applied to ADR measurement circuit 18 which determines line-of-sight range changes as discussed above with respect to FIG. 1.

Figure 9:
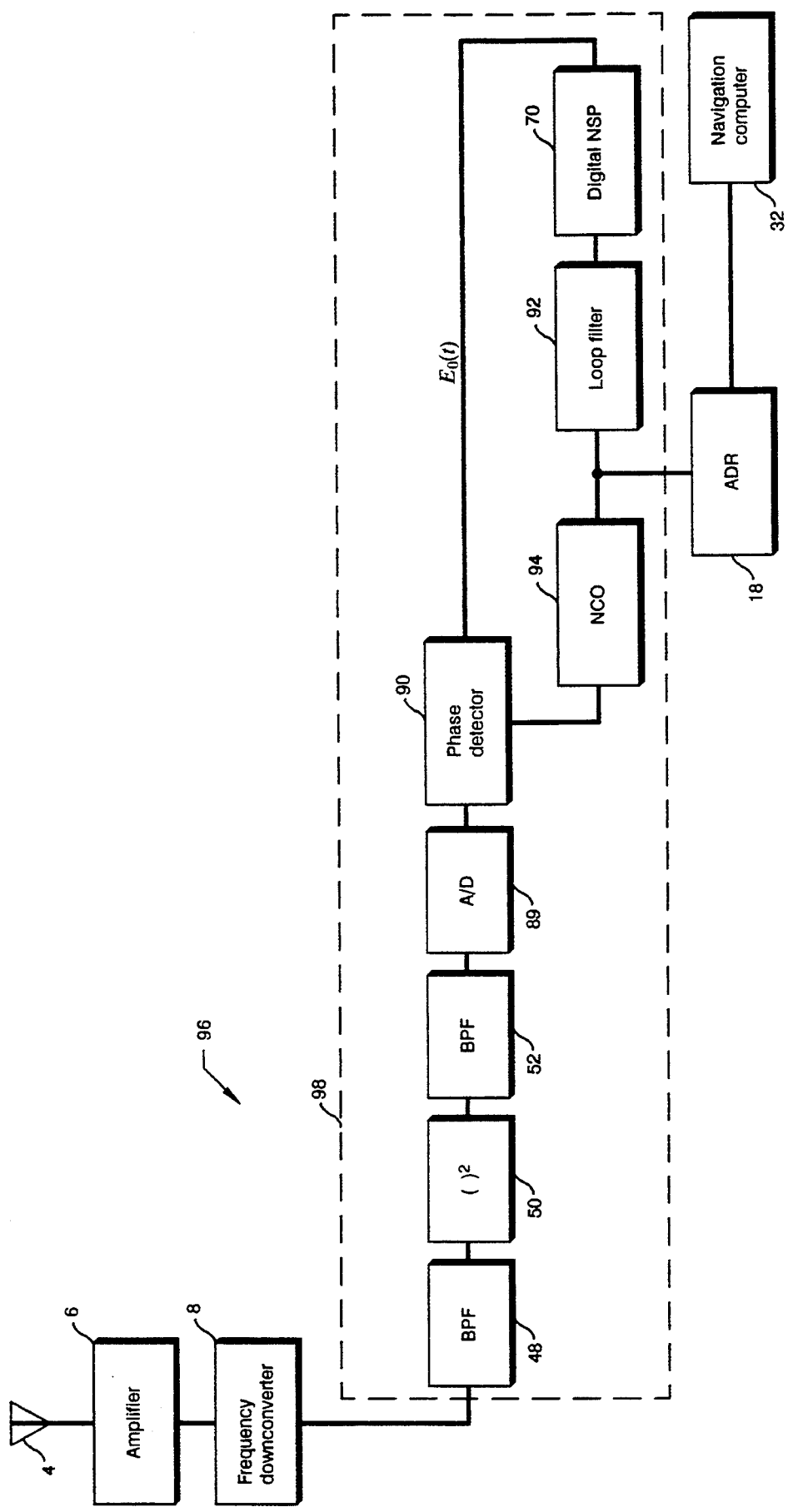
FIG. 9 shows the noise suppression processor of FIG. 7a in a receiver having a digital squaring loop.

FIG. 9 shows a receiver 96 which is identical to receiver 46 of FIG. 5 with the exception that a digital squaring loop 98 is used as the carrier tracking loop in place of analog squaring loop 47. Digital squaring loop 98 is a conventional digital squaring loop to which digital noise suppression processor 70 has been added between digital phase detector 90 and digital loop filter 92. Digital squaring loop 98 includes a band pass filter 48 which receives the down-converted signal produced by frequency down-converter 8. The filtered down-converted signal produced by band pass filter 48 is squared by squaring circuit 50, filtered by band pass filter 52, and converted to a digital value by analog-to-digital converter 89. Digital phase detector 90 receives signals from analog-to-digital converter 89 and NCO 94 at first and second inputs, respectively, and produces the loop error signal $E_0(t)$ which is processed by digital noise suppression processor 70 as discussed above with respect to FIG. 7b. Digital loop filter 92 produces a control signal which causes the output signal of NCO 94 to become synchronous with the output signal of analog-to-digital converter 89. The control signal produced by digital loop filter 92 is also applied to ADR measurement circuit 18 which determines line-of-sight range changes as discussed above with respect to FIG. 1.

Figure 10:
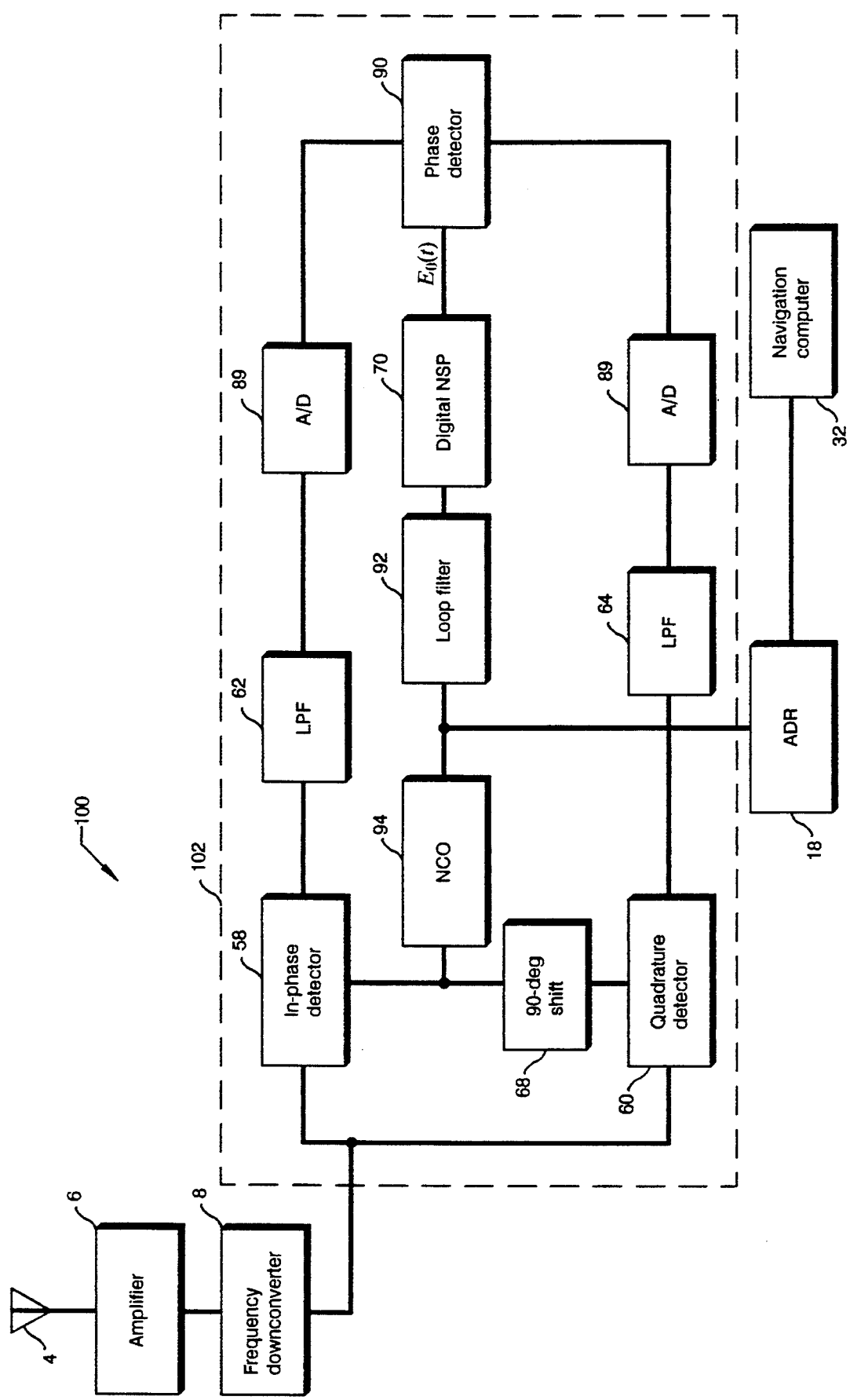
FIG. 10 shows the noise suppression processor of FIG. 7a in a receiver having a digital Costas loop.

FIG. 10 shows a receiver 100 which is identical to receiver 54 of FIG. 6 with the exception that a digital Costas loop 102 is used as the carrier tracking loop in place of analog Costas loop 56. Digital Costas loop 102 is a conventional digital Costas loop to which digital noise suppression processor 70 has been added between digital phase detector 90 and digital loop filter 92. Digital Costas loop 102 includes in-phase detector 58 and quadrature phase detector 60, each of which receives the down-converted signal from frequency down-converter 8 at a first input. In-phase detector 58 also receives a signal from NCO 94 at a second input and produces an output signal which is filtered by low pass filter 62, converted to a digital value by analog-to-digital converter 89, and then applied to a first input of digital phase detector 90. Quadrature phase detector 60 receives a signal from NCO 94 which has been shifted 90 degrees by phase shifter 68 at a second input and produces an output signal which is filtered by low pass filter 64, converted to a digital value by analog-to-digital converter 89, and applied to a second input of digital phase detector 90. Digital phase detector 90 produces the loop error signal $E_0(t)$ which is processed by digital noise suppression processor 70 as discussed above with respect to FIG. 7b and applied to digital loop filter 92. Digital loop filter 92 produces a control signal which causes the output of NCO 94 to become synchronous with the output signal of frequency down-converter 8. The control signal produced by digital loop filter 92 is also applied to ADR measurement circuit 18 which determines line-of-sight range changes as discussed above with respect to FIG. 1.

In FIGS. 8, 9, and 10, phase detector 90, digital loop filter 92, and ADR measurement circuit 18 may be eliminated and the program stored in digital noise suppression processor 70 modified to perform their functions.

Figure 11:
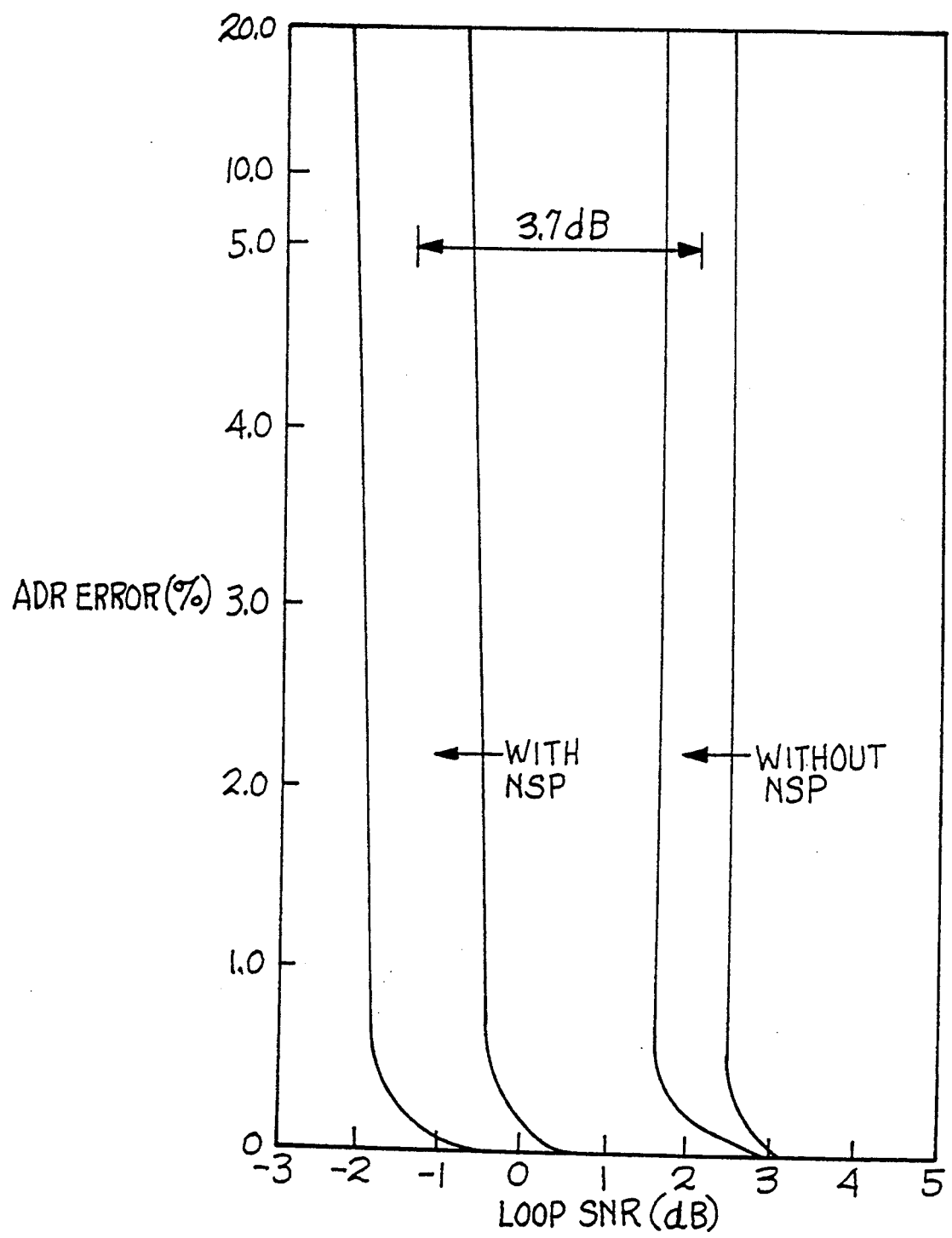
FIG. 11 is a graph showing ADR error as a function of signal-to-noise ratio for a simulated carrier tracking loop with and without the noise suppression processor of the present invention.
Figure 12:
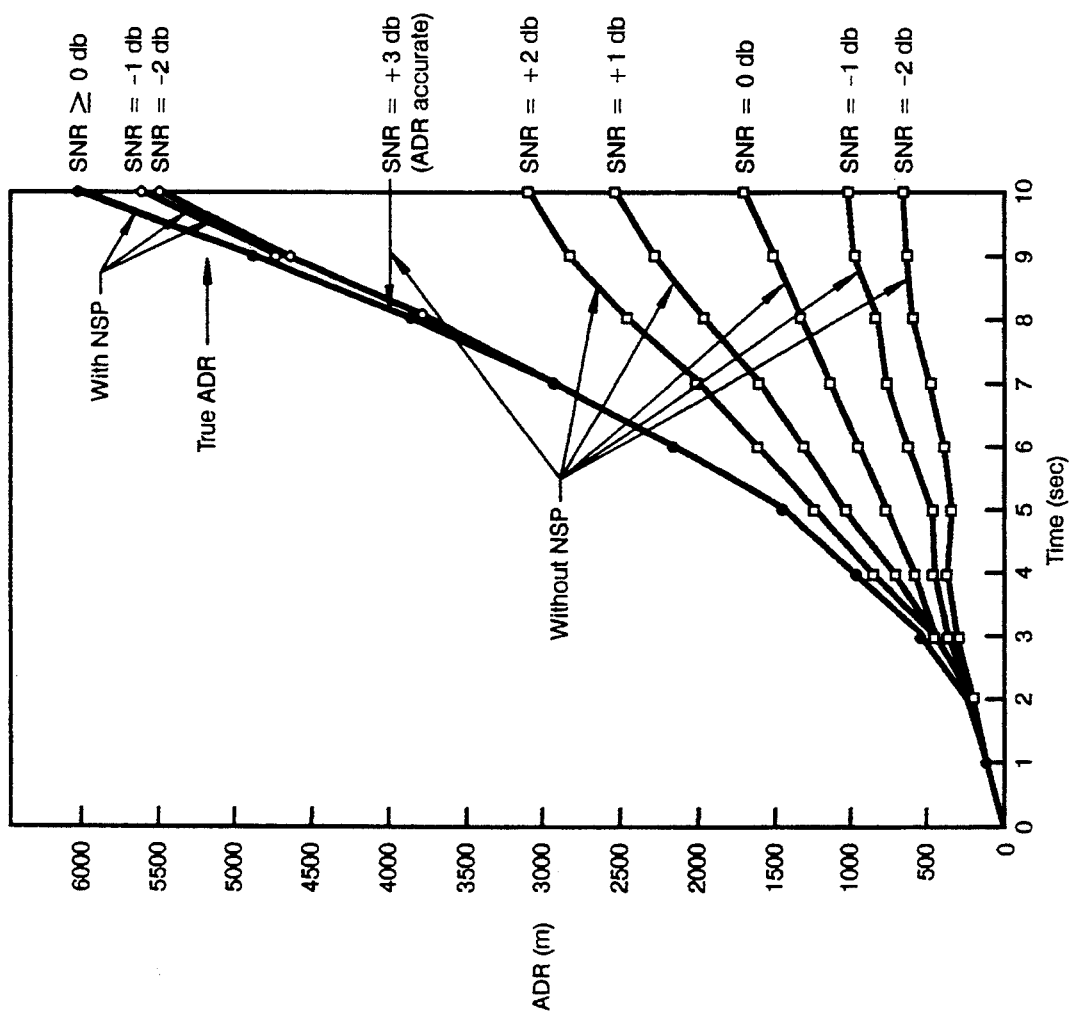
FIG. 12 is a graph showing ADR measurements as a function of time for several signal-to-noise ratios in a simulated carrier tracking loop with and without the noise suppression processor of the present invention.

FIGS. 11 and 12 show the results of Costas digital carrier tracking loop simulations conducted with the noise suppression processor of the present invention in the loop and without the noise suppression processor in the loop. Identical noise variables were used in both instances. The simulation was performed with a receiver acceleration of 118 meters/second$^2$ sustained for 10 seconds and carrier frequency of 1575.42 MHz. This results in a doppler rate of $\omega_D = 3893$ radians/second$^2$. The carier tracking loop simulation used the minimum allowable loop bandwidth and signal-to-noise ratio to achieve the greatest noise immunity possible using the prior art technique of bandwidth reduction. The minimum allowable loop bandwidth, $\omega_{nmin}$ from equation 3, is given by:

$$\omega_{nmin} = 10 \cdot 3893/\pi = 111 \text{ radians/second} = 18 \text{Hz}.$$

The minimum possible signal-to-noise ratio without the noise suppression processor, $SNR_{min}$ from equation 4, is given by:

$$SNR_{min} = 10\log(111/(20\pi)) = 2.5 \text{dB}.$$

FIG. 11 shows the accumulated delta range (ADR) error in percent, that is, the difference between the actual ADR and the measured ADR as a percentage of the actual ADR, plotted as a function of loop signal-to-noise ratio. For all values of ADR error, the use of the noise suppression processor in the carrier tracking loop extended the carrier lock capability to signal-to-noise ratios which were, on the average, 3.7 dB lower than signal-to-noise ratios possible without the noise suppression processor.

FIG. 12 shows ADR measurements made during the 10 second acceleration plotted as a function of time for several signal-to-noise ratios with and without the use of the noise suppression processor. As can be seen from FIG. 12, the use of the noise suppression processor in the carrier tracking loop permitted accurate ADR measurements with signal-to-noise ratios which were significantly lower than those required for accurate ADR measurements without the noise suppression processor.. ADR measurements made with the noise suppression processor were equal to the actual or true accumulated delta range for signal-to-noise ratios which were greater than or equal to 0dB. Measurements made without the noise suppression processor, on the other hand, were equal to the actual accumulated delta range when the signal-to-noise ratio was +3dB.

For signal-to-noise ratios of +2dB or less, the carrier tracking loop without the noise suppression processor definitively lost lock on the received signal after only approximately two seconds. As a result, ADR measurements made without the noise suppression processor for signal-to-noise ratios of +2dB or less were extremely inaccurate by the end of the ten second simulation. In contrast, even for signal-to-noise ratios of −1dB and −2dB, ADR measurements made with the noise suppression processor were fairly close to the true accumulated delta range at the end of the ten second simulation. The slight error in these measurements is due to the cumulative effect of occassional cycle slipping during the ten seconds.

Although several specific embodiments have been described, it will be understood that many modifications of the present invention are possible without departing from the spirit and scope of the invention as set forth in the appended claims.

I claim:

1. An apparatus for maintaining a carrier tracking loop having a phase detector which produces a loop error signal and a loop filter which filters the loop error signal in lock in the presence of noise, comprising:
   a means for receiving the loop error signal from the phase detector;
   a means for processing the received loop error signal by nonlinearly amplifying the loop error signal $E_0(t)$ by $1+E_0^2(t)/\eta$, where:
   $\eta = A^2/\pi$, and
   A = maximum noiseless amplitude of error signal $E_0(t)$ and limiting the amplified loop error signal to predetermined maximum and minimum values; and
   a means for supplying the processed loop error signal to the loop filter.

2. An apparatus, as in claim 2, in which the means for processing limits values of the amplified loop error signal which are greater than or equal to 1.2A to a predetermined maximum value of 1.2A and limits values of the amplified loop error signal which are less than or equal to −1.2A to a predetermined minimum value of −1.2A.

3. An apparatus for maintaining a carrier tracking loop having a phase detector which produces a loop error signal and a loop filter which filters the loop error signal in lock in the presence of noise, comprising:
   a means for receiving the loop error signal from the phase detector;
   a means for processing the received loop error signal by nonlinearly amplifying the loop error signal $E_0(t)$ according to the transfer function $N[E_0(t)]$ given by:

$N[E_0(t)] = 1.2A$ for $E_0(t) + E_0^3(t)/\eta \geq 1.2A;$ $N[E_0(t)] = E_0(t) + E_0^3(t)/\eta$ for $-1.2A < E_0(t) + E_0^3(t)/\eta < 1.2A;$ and
   $N[E_0(t)] = -1.2A$ for $E_0(t) + E_0^3(t)/\eta \leq -1.2A,$ where:
   $\eta = A^2/\pi$, and
   A = maximum noiseless amplitude or error signal $E_0(t)$, and limiting the amplified loop error signal to predetermined maximum and minimum values; and
   a means for supplying the processed loop error signal to the loop filter.

4. An apparatus, as in claim 3, in which the means for processing comprises:
   a first multiplier responsive to the loop error signal $E_0(t)$ for producing an output signal equal to $E_0^2(t)$;
   a second multiplier response to the loop error signal $E_0(t)$ and the output signal of the first multiplier for producing an output signal equal to $E_0^3(t)$;
   an amplifier responsive to the output signal of the second multiplier for producing an output signal equal to $E_0^3(t)/\eta$;
   a summer responsive to the loop error signal $E_0(t)$ and the output signal of the amplifier for producing an output signal to $E_0(t)+E_0^3(t)/\eta$; and
   a limiter responsive to the output signal of the summer of producing the processed loop error signal, the processed loop error signal being equal to 1.2A for values of the output signal of the summer which are greater than or equal to 1.2A, equal to the output signal of the summer for values of the output signal of the summer greater than −1.2A and less than 1.2A, and equal to −1.2A for values of the output signal of the summer which are less than or equal to −1.2A.

5. An apparatus, as in claim 3, in which the means for processing comprises a digital processor which implements the transfer function according to stored program.

6. A carrier tracking loop for use in a receiver which measures range changes from a remote transmitter, comprising:
   a phase detector responsive to first and second signals for producing a loop error signal related to the phase difference between the first and second signals;
   a means for processing the loop error signal by nonlinearly amplifying the loop error signal $E_0(t)$ by $1+E_0^2(t)/\eta$ to produce an amplified loop error signal given by $E_0(t)+E_0^3(t)/\eta$, where:
   $n = A^2/\pi$, and
   A = maximum noiseless amplitude of error signal $E_0(t)$, and limiting the amplified loop error signal to predetermined maximum and minimum values to maintain the carrier tracking loop in lock in the presence of noise; and
   a loop filter responsive to the processed loop error signal for producing a control signal.

7. A carrier tracking loop, as in claim 6, in which the means for processing limits values of the amplified loop error signal which are greater than or equal to 1.2A to a predetermined maximum value of 1.2A and limits values of the amplified loop error signal which are less than or equal to −1.2A to a predetermined minimum value of −1.2A.

8. A carrier tracking loop for use in a receiver which measures range changes from a remote transmitter, comprising:
   a phase detector responsive to first and second signals for producing a loop error signal related to the phase difference between the first and second signals;
   a means for processing the loop error signal by nonlinearly amplifying the loop error signal $E_0(t)$ according to the transfer function $N[E_0(t)]$ given by:

$N[E_0(t)] = 1.2A$ for $E_0(t) + E_0^3(t)/\eta \geq 1.2A;$ $N[E_0(t)] = E_0(t) + E_0^3(t)/\eta$ for $-1.2A < E_0(t) + E_0^3(t)/\eta < 1.2A;$ and
   $N[E_0(t)] = -1.2A$ for $E_0(t) + E_0^3(t)/\eta \leq -1.2A,$ where:
   $\eta = A^2/\pi$, and
   A = maximum noiseless amplitude of error signal $E_0(t)$, and limiting the amplified loop error signal to predetermined maximum and minimum values to maintain the carrier tracking loop in lock in the presence of noise; and
   a loop filter responsive to the processed loop error signal for producing a control signal.

9. A carrier tracking loop, as in claim 8, in which the means for processing comprises:
   a first multiplier responsive to the loop error signal $E_0(t)$ for producing an output signal equal to $E_0^2(t)$;
   a second multiplier response to the loop error signal $E_0(t)$ and the output signal of the first multiplier for producing an output signal equal to $E_0^3(t)$;
   an amplifier responsive to the output signal of the second multiplier for producing an output signal equal to $E_0^3(t)/\eta$;
   a summer responsive to the loop error signal $E_0(t)$ and the output signal of the amplifier for producing an output signal to $E_0(t)+E_0^3(t)/\eta$; and
   a limiter responsive to the output signal of the summer of producing the processed loop error signal, the processed loop error signal being equal to 1.2A for values of the output signal of the summer which are greater than or equal to 1.2A, equal to the output signal of the summer for values of the output signal of the summer greater than $-1.2A$ and 1.2A, and equal to $-1.2A$ for values of the output signal of the summer which are less than or equal to $-1.2A$.

10. A carrier tracking loop, as in claim 8, in which the means for processing comprises a digital processor which implements the transfer function according a stored program.

11. A carrier tracking loop, as is claim 6, further comprising an oscillator responsive to the control signal for producing the second signal, the first signal being received from the remote transmitter.

12. A receiver for measuring range changes from a remote transmitter, comprising:
   a means for receiving a signal from a remote transmitter;
   a carrier tracking loop for tracking the phase of the received signal, the carrier tracking loop comprising a phase detector responsive to first and second signals for producing a loop error signal related to the phase difference between the first and second signals, a means for processing the loop error signal by nonlinearly amplifying the loop error signal $E_0(t)$ by $1+E^{02}(t)/\eta$, where:
   $n=A^2/\pi$, and
   $A$=maximum noiseless amplitude of error signal $E_0(t)$, and limiting the amplified loop error signal to predetermined maximum and minimum values to maintain the carrier tracking loop in lock in the presence of noise, and a loop filter responsive to the processed loop error signal for producing a control signal; and
   a means responsive to the control signal for determining range changes from the remote transmitter.

13. A receiver, as in claim 12, in which the means for processing limits values of the amplified loop error signal which are greater than or equal to 1.2A to a predetermined maximum value of 1.2A and limits values of the amplified loop error signal which are less than or equal to $-1.2A$ to a predetermined minimum value of $-1.2A$.

14. A carrier tracking loop for use in a receiver which measures range changes from a remote transmitter, comprising:
   a phase detector responsive to first and second signals for producing a loop error signal related to the phase difference between the first and second signals;
   a means for processing the loop error signal by nonlinearly amplifying the loop error signal and limiting the amplified loop error signal to predetermined maximum and minimum values to maintain the carrier tracking loop in lock in the presence of noise;
   a loop filter responsive to the processed loop error signal for producing a control signal;
   a first band pass filter responsive to a third signal received from the remote transmitter for producing an output signal;
   a means for squaring the output signal of the first bandpass filter;
   a second band pass filter responsive to the squared output signal for producing the first signal; and
   an oscillator responsive to the control signal for producing the second signal.

15. A carrier tracking loop for use in a receiver which measures range change from a remote transmitter, comprising:
   a phase detector responsive to first and second signals for producing a loop error signal related to the phase difference between the first and second signals;
   a means for processing the loop error signal by nonlinearly amplifying the loop error signal and limiting the amplified loop error signal to predetermined maximum and minimum values to maintain the carrier tracking loop in lock in the presence of noise;
   a loop filter responsive to the processed loop error signal for producing a control signal;
   an in-phase detector responsive to a third signal received from the remote transmitter and a fourth signal for producing an output signal;
   a filter responsive to the output signal from the in-phase detector for producing the first signal;
   a quadrature phase detector responsive to the third signal received from the remote receiver and a fifth signal for producing an output signal;
   a filter responsive to the output signal of the quadrature phase detector for producing the second signal;
   an oscillator responsive to the control signal for producing the fourth signal; and
   a phase shifter responsive to the fourth signal for producing the fifth signal.

16. A receiver for measuring range changes from a remote transmitter, comprising:
   a means for receiving a signal from a remote transmitter;
   a carrier tracking loop for tracking the phase of the received signal, the carrier tracking loop comprising a phase detector responsive to first and second signals for producing a loop error signal related to the phase difference between the first and second signals, a means for processing the loop error signal by nonlinearly amplifying the loop error signal $E_0(t)$ according to the transfer function $N[E_0(t)]$ given by:

$$N[E_0(t)] = 1.2A \text{ for } E_0(t) + E_0^3(t)/\eta \geq 1.2A;$$
$$N[E_0(t)] = E_0(t) + E_0^3(t)/\eta \text{ for }$$
$$-1.2A < E_0(t) + E_0^3(t)/\eta < 1.2A;$$
and -continued
$$N[E_0(t)] = -1.2A \text{ for } E_0(t) + E_0^3(t)/\eta \leq -1.2A,$$

where:

$\eta = A^2/\pi$, and

A=maximum noiseless amplitude of error signal $E_0(t)$, and limiting the amplified loop error signal to predetermined maximum and minimum values to maintain the carrier tracking loop in lock in the presence of noise, and a loop filter responsive to the processed loop error signal for producing a control signal; and a means responsive to the control signal for determining range changes from the remote transmitter.

17. A carrier tracking loop, as in claim 8, further comprising an oscillator responsive to the control signal for producing the second signal, the first signal being received from the remote transmitter.

* * * * *